United States Patent

Muller

[11] Patent Number: 6,033,995
[45] Date of Patent: Mar. 7, 2000

[54] INVERTED LAYER EPITAXIAL LIFTOFF PROCESS

[75] Inventor: Heinrich G. Muller, Culver City, Calif.

[73] Assignee: TRW Inc., Redondo Beach, Calif.

[21] Appl. No.: 08/931,695

[22] Filed: Sep. 16, 1997

[51] Int. Cl.$^7$ ................................................. H01L 21/00
[52] U.S. Cl. ........................... 438/749; 438/750; 438/751; 438/458; 438/493; 438/494; 438/498; 438/502; 438/504; 438/509
[58] Field of Search ..................................... 438/745, 749, 438/750, 751, 455, 458, 459, 492, 493, 494, 496, 497, 498, 500, 502, 503, 504, 507, 509

[56] References Cited

U.S. PATENT DOCUMENTS

| | | | |
|---|---|---|---|
| 3,773,707 | 11/1973 | Hermann | 260/37 N |
| 4,509,063 | 4/1985 | Sugitani et al. | 346/140 R |
| 4,732,858 | 3/1988 | Brewer et al. | 437/228 |
| 4,952,535 | 8/1990 | Merkel | 501/96 |
| 5,286,335 | 2/1994 | Drabik et al. | 156/631 |
| 5,376,579 | 12/1994 | Annamalai | 437/126 |
| 5,462,883 | 10/1995 | Dennard et al. | 437/21 |
| 5,527,872 | 6/1996 | Allman | 528/12 |

*Primary Examiner*—Nam Nguyen
*Assistant Examiner*—Steven H. Ver Steeg
*Attorney, Agent, or Firm*—Michael S. Yatsko

[57] ABSTRACT

The invention relates to a method for integrating semiconductor device epilayers with arbitrary host substrates, where an indium gallium arsenide etch-stop layer (34) is deposited on an indium phosphide growth substrate (32) and device epilayers (36, 38) are grown on the etch-stop layer in inverse order from their final orientation. The device epilayers are then joined to an aluminum nitride host substrate (42) by inverting the growth substrate and device epilayers. The epilayers are bonded to the host substrate using monomolecular layer forming bonding material and the growth substrate is selectively etched away from the device epilayers. As a result of the inverse epilayer growth, the epilayers are not removed from the growth substrate prior to bonding to the host substrate, thus protecting the device epilayers and reducing processing steps. Additionally, by mono-molecular bonding, sturdy semiconductor devices are formed with low thermal impedance.

17 Claims, 2 Drawing Sheets

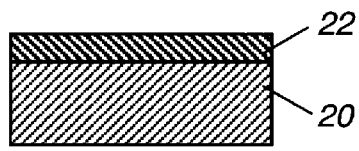
Figure 1a
Prior Art
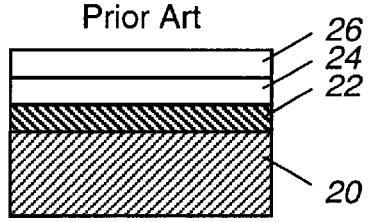
Figure 1b
Prior Art
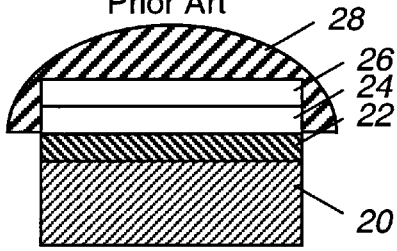
Figure 1c
Prior Art
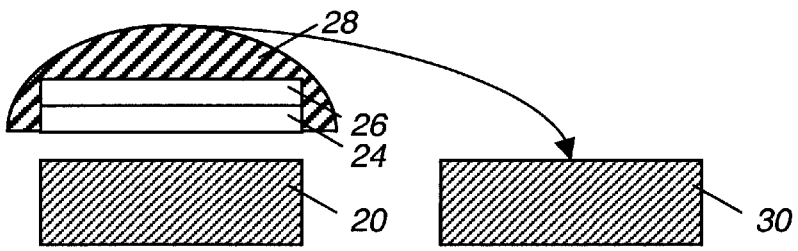
Figure 1d
Prior Art
Figure 1e
Prior Art
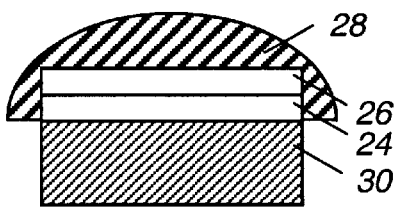
Figure 1f
Prior Art
Figure 1g
Prior Art

INVERTED LAYER EPITAXIAL LIFTOFF PROCESS

BACKGROUND OF THE INVENTION

1. Field of the Invention

The present invention relates to a method for integrating epitaxial semiconductor device layers with arbitrary host substrates, wherein the epilayers are grown on a growth substrate in an inverse order and joined to a host substrate in a manner that alleviates removal of the epilayers from the growth substrate prior to bonding the epilayers to the host substrate, and bonds the epilayers to the host substrate in a manner which maximizes the strength, yield, and the thermal conductivity of the resulting semiconductor device.

2. Description of the Prior Art

Methods for the integration of epitaxial quality semiconductor device layers with arbitrary host substrates are generally known in the art. These methods of integration are beneficial since device epilayers can be combined with arbitrary substrates which have better optical, mechanical or thermal properties. One type of integration may be accomplished by a method known as lattice-mismatched heteroepitaxial growth. For example, GaAs device epilayers are grown on Si substrates. This method, however, has a significant disadvantage, in that the crystal quality of the resulting material is often insufficient for some microelectronic applications. An alternative method which seeks to preserve the high material quality of lattice-matched device epilayers, while still allowing the integration of device epilayers with other substrates, is the epitaxial liftoff process (ELO). Examples of the ELO process are disclosed in the following and numerous other publications: "Van der Waals bonding of GaAs epitaxial liftoff films onto arbitrary substrates", Appl. Phys. Lett. 56 pp. 2419–2421, 1990; and "Alignable Epitaxial Liftoff of GaAs Materials with Selective Deposition Using Polyimide Diaphragms", IEEE Trans. Phot. Techn. Lett. 3 p. 1123, 1991.

In epitaxial liftoff, a thin sacrificial (AlAs) or etch-stop layer 22 is grown on a growth substrate (GaAs) 20, as illustrated in FIG. 1a. Device epilayers are grown sequentially on the sacrificial layer beginning with a first device epilayer 24 and followed by a second device epilayer 26 until all epilayers are grown as required by the type of semiconductor device, shown in FIG. 1b. Next, the device epilayers are covered with a wax-like material (Apiezon W) 28 prior to "liftoff", as shown in FIG. 1c. The GaAs epilayers are then "lifted off" from the growth substrate 20 by etching away the sacrificial layer 22, as illustrated in FIG. 1d. Following the epilayer "lift off", the GaAs epilayers are maintained suspended in the wax-like material 28 until they are bonded to the new host substrate 30, as shown in FIGS. 1e and 1f. Finally, the wax-like material 28 is removed, as shown in FIG. 1g. Although epitaxial liftoff provides, most significantly, a means to integrate high quality epilayers with "best match" host substrates, the wax-like material used for the transfer of epilayers from growth to host substrates presents some problems. The wax-like material does not provide sufficient mechanical protection of the device epilayers, which in turn can cause electronic yield loss. The wax-like material needs to be dissolved in trichloroethylene and the use of trichloroethylene has associated environmental concerns. The use of the wax-like material also makes it impossible to align the "lifted off" epilayers to any pattern on the host substrate because of the opaque nature of the wax-like material.

In epitaxial liftoff processes, "lifted off" epilayers must be bonded to the new host substrate. Various methods are known for bonding device epilayers to host substrates, for example, as disclosed in "Van der Waals bonding of GaAs epitaxial liftoff films onto arbitrary substrates", Appl. Phys. Lett. 56 pp.2419–2421, 1990. This publication describes the "Van der Waals" bonding process where epilayers, while suspended in wax-like material, are rinsed with de-ionized water and partially dried. A very small amount of water is left behind. The surface tension of the de-ionized water acts initially to pull the epilayers down onto the host substrate. Then pressure must be applied to remove all but one optical fringe thickness of water. The remaining trace of water evaporates, leaving a permanent bond between epilayers and substrate. While the "Van der Waals" bonding process can be sufficient to achieve closer coupling between the epilayers and host substrate, and allow for further thermal processing or better thermal conduction by eliminating the explicit need for bonding adhesives, "Van der Waals" bonds tend to be much weaker and less reliable than other bonds.

The publication, "Dielectrically-Bonded Long Wavelength Vertical Cavity Laser on GaAs Substrates Using Strain-Compensated Multiple Quantum Wells", IEEE Phot. Techn. Lett. 6 p. 1400, 1994 discloses an alternate bonding technique. This approach relies on an intermediate dielectric (glass) layer to bond compound semiconductor devices with other substrates. The bonding solution is a glass-forming aqueous mixture. This mixture is spun on both the semiconductor device and the host substrate. Immediately after spinning, the device and host substrate are placed face to face where they adhere to each other. The resulting pair is then baked and the spin-on solution turns into a strong layer of glass sandwiched between the device and the host substrate. This method affords a strong bond with low optical loss but may not be optimal when bonding small device epilayers with substrates. Spinning a solution uniformly over a large and symmetric surface is easier than spinning the same solution on a small surface. In addition, dielectric bonds have very low thermal conductivity and are therefore not useful to make contact with thermally highly conductive host substrates.

Unfortunately, the "lift off" method disclosed above requires the use of a wax-like material to remove the device epilayers from the growth substrate and to transfer the device epilayers to the new host substrate. The use of such material poses a number of problems. First, additional processing steps are required for both the application and removal of the wax-like material. Regarding the removal of the wax-like material, the solution required to dissolve the wax-like material poses environmental concerns. Additionally, the fragile device epilayers, while suspended in the wax-like material, are not provided with sufficient protection from mechanical damage, thus potentially jeopardizing the electronic yield of the semiconductor device. Finally, as mentioned above, the wax-like material makes alignment of the device epilayers with patterns on host substrates difficult because of the opaqueness of the wax-like material.

There are also problems associated with the disclosed bonding methods. The "Van der Waals" bonding method, as described above, does not result in strong device epilayer to host substrate bonds, therefore compromising the overall strength of the resulting semiconductor device. Dielectric bonding methods require more complicated "spin on" bonding techniques and the spinning process does not produce the best results on small surface areas. Adhesive bonding methods typically produce strong bonds, but the adhesive material may contribute to low thermal conductance.

For the aforementioned reasons, there is a need for a "liftoff" method which does not require the wax-like material. There is also a need for a bonding method which produces robust semiconductor devices with optimal thermal contact to the host substrate of the semiconductor devices.

SUMMARY OF THE INVENTION

Briefly, the present invention relates to methods for integrating device epilayers to host substrates by growing device epilayers in an inverse order on a growth substrate and effectively bonding device epilayers to host substrates. The inverse growth of the epitaxial layers allows the device epilayers to be joined to host substrates without the need for removing the device epilayers from the growth substrates prior to their being joined to host substrates. Consequently, the number and difficulty of steps required to integrate device epilayers with host substrates are reduced and the fragile device epilayers are better protected. Further, a more effective bonding technique comprising mono-molecular layer forming, non-metallic adhesion promoters provides the following advantages: the epilayer to substrate bond is stronger, there is low thermal resistance between the device epilayer and host substrate, and the bonding layer is electrically insulating which is important for semiconductor devices used at mm-wave frequencies.

It is an aspect of the present invention to provide a method for integrating epitaxial device layers with host substrates. The method comprises the steps of depositing a thin etch-stop layer on a growth substrate; growing the second device epilayer on the etch-stop layer; growing the first device epilayer on the second device epilayer; joining the device epilayers and the growth substrate to the host substrate by bonding the first device epilayer to a surface of the host substrate; and finally, selectively etching the growth substrate from the device epilayers.

Another aspect of the present invention is to provide a method for bonding a device epilayer to a host substrate. The method comprising the steps of applying a layer of adhesion promoter between the device epilayer and the host substrate; joining the device epilayer to the host substrate to form a compound structure which contains the device epilayer and the host substrate; and finally, applying pressure to the compound structure while simultaneously baking the compound structure for a time and at a temperature sufficient to form chemical bonds between the adhesion promoter, the device epilayer, and the host substrate.

BRIEF DESCRIPTION OF THE DRAWINGS

Reference is now made to the following specification and attached drawings, wherein:

FIGS. 1a–1g are illustrations of known epitaxial liftoff processing steps used for integrating device epilayers with arbitrary host substrates.

DETAILED DESCRIPTION OF THE INVENTION

Figure 2A:
FIGS. 2a–2f are illustrations of the steps used for integrating device epilayers with arbitrary substrates in accordance with the present invention.

As previously mentioned, the present invention relates to an improvement in the method for integrating semiconductor device epilayers with arbitrary host substrates. One aspect of the invention is the inverse growth sequence of epitaxial device layers on growth substrates. The inverse growth sequence of device epilayers allows the device epilayers to be joined to host substrates without first separating the device epilayers from their growth substrate. Further, the present invention relates to a method for bonding device epilayers with host substrates which allows the fabrication of semiconductor devices which are sturdy and have an optimal thermal contact between the device epilayer and host substrate.

It should be understood by those of ordinary skill in the art that the principles of the present invention are applicable to many types of semiconductor devices, such as optical devices, surface acoustic wave devices, RF devices, and integrated sensors. The principles of the present invention are also applicable to many types of host substrates, such as silicon (Si), gallium arsenide (GaAs), and diamond. For best results, it is desirable that the host substrate have optimal thermal conduction properties and compatible thermal expansion coefficient with the device epilayers. Further, the principles of the present invention are applicable to semiconductor devices which may require more than a first and second device epilayer. The number of device epilayers required for a semiconductor device depends on the type of semiconductor device. For illustration, the invention is described and illustrated further in FIGS. 2a through 2f with a growth substrate 32, etch-stop layer 34, second device epilayer 36, first device epilayer 38, and host substrate 42.

More specifically, and with reference to the drawings, the first step of the integration process, as illustrated in FIG. 2a, is the deposition of an indium gallium arsenide (InGaAs) etch-stop layer 34 on a indium phosphide (InP) growth substrate 32. The growth substrate 32 composition is preferred for its compatibility with selective etching processes. The etch-stop layer 34 composition is preferred for its selective etching properties. It is important to note that other materials can be used for the growth substrate, host substrate, and etch-stop layer. For example, the growth substrate may be gallium arsenide (GaAs). Host substrate choices may include silicon (Si) or diamond and etch-stop layers may include aluminum arsenide (AlAs). For the purposes of this illustration, the host substrate 42 composition (AlN) is preferred for its very close match of thermal expansion coefficients with indium phosphide (InP) epilayers and 200 W/mK thermal conductivity. In general, material choices should be made according to the semiconductor application and thermal expansion match requirements.

Figure 2B:
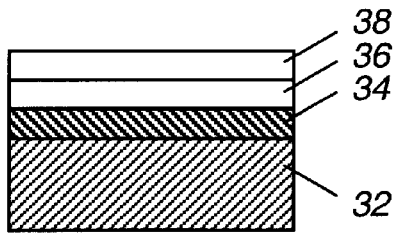
Figure 2C:
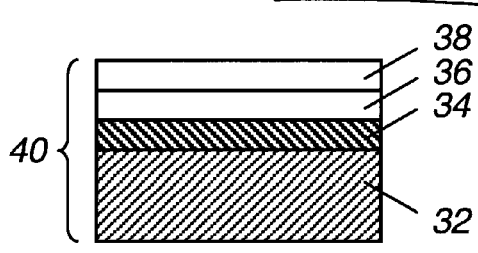
Figure 2D:
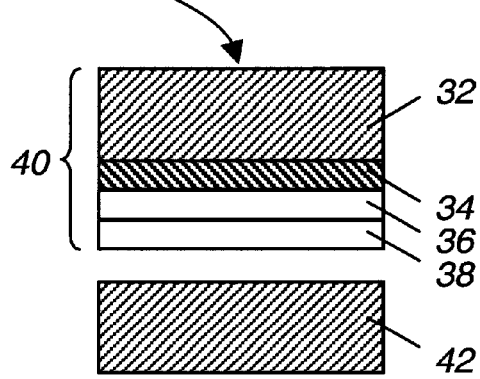

Next, as shown is FIG. 2b, a second device epilayer 36 is grown on the etch-stop layer 34 and a first device epilayer 38 is grown on the second device epilayer 36. It is important to note from FIG. 2b that the device epilayers have been grown on the etch-stop layer 34 in an inverse order from the order in which they will be finally oriented on the host substrate 42. After the second device epilayer 36 and the first device epilayer 38 have been grown on the growth substrate 32, the device epilayers are joined to an aluminum nitride (AlN) host substrate 42, as illustrated in FIG. 2c. This is done by inverting a compound structure 40 containing the growth substrate 32, the etch-stop layer 34, second device epilayer 36, and the first device epilayer 38 and bonding the compound structure 40 to the host substrate 42, as shown in FIG. 2d. Specifically, the bond between the first device epilayer 38 and the growth substrate 42 is formed by the application of mono-molecular layer forming adhesion promoters 46. For the purposes of the illustrated embodiment, γ-amino-propyl-triethoxy-silane adhesion promoter solution is applied to the host substrate 42 by dipping the host substrate 42 in the γ-amino-propyl-triethoxy-silane adhesion promoter solution. The γ-amino-propyl-triethoxy-silane adhesion promoter solution is formed of approximately 93% ethanol, 5% water, and 2% γ-amino-propyl-triethoxy-silane.

Figure 2E:
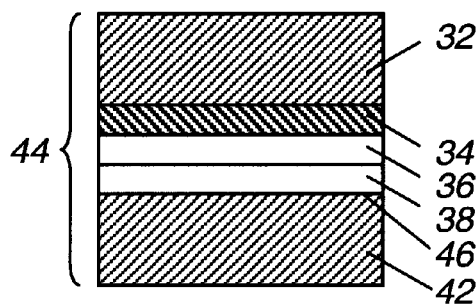

Also, for the purposes of the illustrated embodiment, γ-glycidyl-oxy-propyltrimethoxy-silane adhesion promoter solution is applied to the first device epilayer 38 by dipping the compound structure 40 in the γ-glycidyl-oxy-propyl-trimethoxy-silane adhesion promoter solution. The γ-glycidyl-oxy-propyl-trimethoxy-silane adhesion promoter solution is formed of approximately 93% ethanol, 5% water, and 2% γ-glycidyl-oxypropyl-trimethoxy-silane. The preferred combined adhesion promoter thickness being from 1 to 10 nanometers. Next, the first device epilayer 38 is joined to the host substrate 42, as shown in FIG. 2e, resulting in a compound structure 44. The compound structure 44 is then baked at a temperature of from 100° C. to 120° C. for a period of from 30 to 50 minutes while simultaneously applying a pressure of about 3 to 7 atmospheres. For the purposes of the illustrated embodiment, the preferred baking temperature is approximately 110°, and the preferred baking time is approximately 45 minutes while applying a pressure of approximately 5 atmospheres.

Figure 2F:
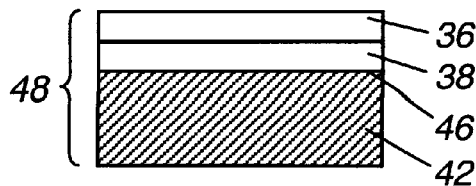

Finally, as shown in FIG. 2f, the growth substrate 32 is separated from the second device epilayer 36 and first device epilayer 38. The growth substrate 32 is removed up to the etch-stop layer 34 in an aqueous hydrochloric acid solution and the etch-stop layer 34 is removed entirely in a sulfuric acid:hydrogen peroxide:water ($H_2SO_4$:$H_2O_2$:$H_2O$) solution in a ratio of 1:1:50. A resulting semiconductor device 48, as illustrated in FIG. 2f, contains the second device epilayer 36 grown on the first device epilayer 38, and the first device epilayer 38 bonded to the host substrate 42. The semiconductor device 48 can now be further fabricated depending on the semiconductor device type.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for integrating indium epitaxial device layers with substrates where the resulting semiconductor device has a first device epilayer bonded to a host substrate and a second device epilayer which resides on the first device epilayer, said method comprising the steps of:

depositing a thin etch-stop layer on an indium phosphide growth substrate;

after depositing, growing an indium phosphide second device epilayer on the etch-stop layer;

after growing the second device epilayer, growing an indium phosphide first device epilayer on the second device epilayer;

after the first device epilayer growth step, joining the device epilayers and the growth substrate to an aluminum nitride host substrate by bonding the first device epilayer to a surface of the host substrate; and selectively etching the device epilayers from the growth substrate.

2. The method as recited in claim 1, wherein depositing the etch-stop layer comprises depositing an indium gallium aresenide etch stop layer.

3. The method as recited in claim 1, wherein selectively etching the device epilayers from the growth substrate, comprises:

removing the growth substrate up to an etch-stop layer by using an aqueous hydrochloric acid solution; and removing the etch-stop layer in a sulfuric acid:hydrogen peroxide:water etching solution.

4. The method as recited in claim 1, wherein selectively etching the device epilayers from the growth substrate, further comprises removing the growth substrate at a sacrificial etch layer.

5. A method for bonding a device epilayer to a host substrate, comprising the steps of:

applying a first adhesion promoter to a surface of the device epilayer;

applying a second adhesion promoter to a surface of the host substrate;

joining the device epilayer to the host substrate to form a compound structure which contains the device epilayer and the host substrate; and applying pressure to the compound structure; while simultaneously;

baking the compound structure for a time and at a temperature sufficient to form chemical bonds between the first adhesion promotor, the second adhesion promoter, the device epilayer, and the host substrate.

6. The method as recited in claim 5, wherein baking the compound structure comprises forming a mono-molecular bond layer of the first adhesion promoter and the second adhesion promoter.

7. The method as recited in claim 5, wherein applying the first adhesion promoter layer and the second adhesion promoter layer comprises applying the first adhesion promoter layer and the second adhesion promoter layer to a combined thickness of less than 10 nanometers.

8. The method as recited in claim 5, wherein applying the first adhesion promoter comprises applying a non-metallic first adhesion promoter substance.

9. The method as recited in claim 5, wherein applying the first adhesion promoter comprises applying a γ-glycidyl-oxy-propyl-trimethoxy-silane first adhesion promoter solution.

10. The method as recited in claim 5, wherein applying the second adhesion promoter comprises applying a γ-amino-propyl-triethoxy-silane second adhesion promoter solution.

11. The method as recited in claim 5, wherein applying pressure to the compound structure comprises applying a pressure of approximately 5 atmospheres.

12. The method as recited in claim 5, wherein baking the compound structure comprises baking the compound structure for a period of approximately 45 minutes.

13. The method as recited in claim 5, wherein baking the compound structure comprises baking at a temperature of approximately 110° Celsius.

14. The method as recited in claim 5, wherein applying pressure to the compound structure and simultaneously baking the compound structure comprises applying a pressure of approximately 5 atmospheres to the compound structure, while simultaneously baking the compound structure for a period of approximately 45 minutes.

15. The method as recited in claim 5, wherein applying pressure to the compound structure and simultaneously baking the compound structure comprises applying a pressure of approximately 5 atmospheres to the compound structure, while simultaneously baking the compound structure at a temperature of approximately 110° Celsius.

16. The method as recited in claim 5, wherein applying the second adhesion promoter comprises applying a non-metallic second adhesion promoter substance.

17. The method as recited in claim 5, wherein applying the second adhesion promoter comprises applying a γ-glycidyl-oxy-propyl-trimethoxy-silane second adhesion promoter solution.

* * * * *